United States Patent
Bang et al.

(10) Patent No.: US 9,005,997 B2
(45) Date of Patent: Apr. 14, 2015

(54) MAGNETO RESISTIVE ELEMENT, DIGITIZER SENSING PANEL INCLUDING THE SAME, DISPLAY DEVICE INCLUDING THE SAME, AND METHOD OF MANUFACTURING THE SAME

(71) Applicant: Samsung Display Co., Ltd., Yongin (KR)

(72) Inventors: Hyun-Sung Bang, Yongin (KR); Won-Jong Kim, Yongin (KR); Ji-Young Choung, Yongin (KR); Joon-Gu Lee, Yongin (KR); Jin-Baek Choi, Yongin (KR); Yeon-Hwa Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 36 days.

(21) Appl. No.: 14/023,054

(22) Filed: Sep. 10, 2013

(65) Prior Publication Data
US 2014/0332766 A1 Nov. 13, 2014

(30) Foreign Application Priority Data

May 9, 2013 (KR) .................. 10-2013-0052750

(51) Int. Cl.
  *H01L 21/00* (2006.01)
  *H01L 51/05* (2006.01)
  *H01L 27/32* (2006.01)
  *H01L 51/00* (2006.01)

(52) U.S. Cl.
  CPC ........ *H01L 51/0591* (2013.01); *H01L 27/3225* (2013.01); *H01L 51/0035* (2013.01)

(58) Field of Classification Search
  CPC .................. H01L 51/0035; H01L 51/0591

USPC ............. 438/3, 57, 82, 99; 257/40, 421, 257/E51.002, E33.044, E29.323
See application file for complete search history.

(56) References Cited

U.S. PATENT DOCUMENTS

| | | | |
|---|---|---|---|
| 8,692,235 B2* | 4/2014 | Wen et al. ........................ 257/40 |
| 2005/0157539 A1* | 7/2005 | Van Der Zaag et al. ...... 365/158 |
| 2006/0043510 A1* | 3/2006 | Yamazaki et al. ............. 257/432 |
| 2006/0091991 A1* | 5/2006 | Wohlgenannt et al. ......... 338/13 |

(Continued)

FOREIGN PATENT DOCUMENTS

| | | |
|---|---|---|
| CN | 001746689 | 3/2006 |
| JP | 08-114639 | 5/1996 |
| JP | 2001-273978 | 10/2001 |
| JP | 2002-340739 | 11/2002 |
| JP | 2008053566 A * | 3/2008 |

(Continued)

*Primary Examiner* — Joseph C Nicely
(74) *Attorney, Agent, or Firm* — H.C. Park & Associates, PLC

(57) ABSTRACT

Provided are a magneto resistive element and a method of manufacturing the same, and in particular, a magneto resistive element and a method of manufacturing the same that may be applied to a digitizer sensing panel. The magneto resistive element includes a substrate, a first electrode disposed on the substrate, a first hole transport layer disposed on the first electrode, a first magneto resistive layer disposed on the first hole transport layer, wherein the first magneto resistive layer comprises an organic material, a first transport layer disposed on the first magneto resistive layer, a second magneto resistive layer disposed on the first transport layer, wherein the second magneto resistive layer comprises an organic material, a first electron transport layer disposed on the second magneto resistive layer, and a second electrode disposed on the first electron transport layer.

19 Claims, 4 Drawing Sheets

(56) References Cited

U.S. PATENT DOCUMENTS

2012/0193816 A1\* 8/2012 Schmid et al. ................. 257/787
2014/0306709 A1\* 10/2014 McCamey et al. ............ 324/316
2014/0346484 A1\* 11/2014 Nendai et al. .................. 257/40

FOREIGN PATENT DOCUMENTS

| JP | 2008-203300 | 9/2008 |
| JP | 2008-292241 | 12/2008 |
| KR | 10-1997-0028972 | 6/1997 |

\* cited by examiner

MAGNETO RESISTIVE ELEMENT, DIGITIZER SENSING PANEL INCLUDING THE SAME, DISPLAY DEVICE INCLUDING THE SAME, AND METHOD OF MANUFACTURING THE SAME

CROSS REFERENCE TO RELATED PATENT APPLICATION

This application claims the benefit of Korean Patent Application No. 10-2013-0052750, filed on May 9, 2013, which is hereby incorporated by reference for all purposes as if fully set forth herein.

BACKGROUND

1. Field

Exemplary embodiments of the present disclosure relate to a magneto resistive element capable of being applied to a digitizer sensing panel, and a method of manufacturing the magneto resistive element.

2. Description of the Background

A magneto resistive element is a circuit element that uses a magneto resistive effect to indicate a change in electrical resistance depending on the intensity of a magnetic field. By using this effect, it is possible to recognize a magnetic field that is applied toward the magneto resistive element.

The magneto resistive element may be applied to a digitizer sensing panel that may sense the position of a magnetic pen changing a magnetic field. The digitizer sensing panel includes a sensing panel and is a device capable of determining X-axis and Y-axis coordinates on the sensing panel. The digitizer sensing panel may operate with a magnetic pen for providing an input at a position on the sensing panel. The sensing panel includes magneto resistive elements whose resistances change depending on a change in a magnetic field. The magnetic pen changes a magnetic field around the sensing panel while approaching the sensing panel. The sensing panel may recognize a position of the magneto resistive element within the sensing panel whose resistance has changed, and may determine the position of the magnetic pen.

As such, since the magneto resistive element uses a differential resistance fraction (DRF) to recognize a change in magnetic field, a magneto resistive element to be installed in a panel should have a sufficient DRF in order to manufacture a digitizer sensing panel of a high resolution and high sensitivity.

The above information disclosed in this Background section is only for enhancement of understanding of the background of the disclosed subject matter and therefore may contain information that does not form the prior art that is already known to a person of ordinary skill in the art

SUMMARY

Exemplary embodiments of the present disclosure provide a magneto resistive element and a method of manufacturing the same.

Additional features of the present disclosure will be set forth in the description which follows, and in part will be apparent from the description, or may be learned by practice of the disclosed subject matter.

Exemplary embodiments of the present disclosure disclose a magneto resistive element including a substrate; a first electrode disposed on the substrate; a first hole transport layer disposed on the first electrode; a first magneto resistive layer disposed on the first hole transport layer, a first transport layer disposed on the first magneto resistive layer; a second magneto resistive layer disposed on the first transport layer; a first electron transport layer disposed on the second magneto resistive layer; and a second electrode disposed on the first electron transport layer. Each of the first magneto resistive layer and the second magneto resistive layer includes an organic material.

Exemplary embodiments of the present disclosure also disclose a digitizer sensing panel including a substrate, a first substrate disposed on the substrate, a second substrate disposed on the substrate, and a magneto resistive element disposed on the substrate. The magneto resistive element includes the first electrode, a first hole transport layer, a first magneto resistive layer, a first transport layer, a second magneto resistive layer, a first electron transport layer, and a second electrode that are sequentially formed. The magneto resistive element is configured to detect an input corresponding to a magnetic field. Each of the first magneto resistive layer and the second magneto resistive layer includes an organic material.

Exemplary embodiments of the present disclosure also disclose a display device including a substrate, an organic light-emitting diode (OLED) disposed on the substrate, and a magneto resistive element disposed on the substrate. The OLED includes a pixel electrode, an intermediate layer, and a counter electrode. The magneto resistive element includes a first electrode, a first hole transport layer, a first magneto resistive layer, a first transport layer, a second magneto resistive layer, a first electron transport layer, and a second electrode. The magneto resistive element is configured to detect an input corresponding to a magnetic field. Each of the first magneto resistive layer and the second magneto resistive layer includes an organic material.

Exemplary embodiments of the present disclosure also disclose a method of manufacturing a magneto resistive element. The method includes forming a first electrode on a substrate; forming a first hole transport layer, a first magneto resistive layer, a first transport layer, a second magneto resistive layer, and a first electron transport layer on the first electrode; and forming a second electrode on the first electron transport layer. Each of the first magneto resistive layer and the second magneto resistive layer includes an organic material.

It is to be understood that both the foregoing general description and the following detailed description are exemplary and explanatory and are intended to provide further explanation of the disclosed subject matter as claimed.

BRIEF DESCRIPTION OF THE DRAWINGS

The accompanying drawings, which are included to provide a further understanding of the disclosed subject matter and are incorporated in and constitute a part of this specification, illustrate exemplary embodiments of the disclosed subject matter, and together with the description serve to explain the principles of the disclosed subject matter.

DETAILED DESCRIPTION OF THE ILLUSTRATED EMBODIMENTS

Figure 1:
FIGS. 1, 2, 3, and 4 are schematic cross-sectional views of a magneto resistive element according to exemplary embodiments of the present disclosure.

Exemplary embodiments of the disclosed subject matter are described more fully hereinafter with reference to the accompanying drawings. The disclosed subject matter may, however, be embodied in many different forms and should not be construed as limited to the exemplary embodiments set forth herein. Rather, the exemplary embodiments are provided so that this disclosure is thorough and complete, and will convey the scope of the disclosed subject matter to those skilled in the art. In the drawings, the size and relative sizes of layers and regions may be exaggerated for clarity. Like reference numerals in the drawings denote like elements.

It will be understood that when an element or layer is referred to as being "on", "connected to", or "coupled to" another element or layer, it can be directly on, connected, or coupled to the other element or layer or intervening elements or layers may be present. In contrast, when an element is referred to as being "directly on", "directly connected to", or "directly coupled to" another element or layer, there are no intervening elements or layers present. As used herein, the term "and/or" includes any and all combinations of one or more of the associated listed items. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the disclosed subject matter. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the disclosed subject matter are described herein with reference to cross-section illustrations that are schematic illustrations of idealized embodiments (and intermediate structures) of the disclosed subject matter. As such, variations from the shapes of the illustrations as a result, for example, of manufacturing techniques and/or tolerances, are to be expected. Thus, exemplary embodiments of the disclosed subject matter should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the disclosed subject matter will be described in detail with reference to the accompanying drawings.

FIGS. 1, 2, 3, 4, and 5 are schematic cross-sectional views of a magneto resistive element (MRE) according to exemplary embodiments of the present disclosure. A process of manufacturing the MRE will be schematically described below.

First, a substrate 10 is provided as shown in FIG. 1. The substrate 10 may include a silicon oxide ($SiO_2$)-based transparent glass material but is not limited thereto. The substrate 10 may include an opaque material and/or various suitable materials, such as a plastic material or a metal material. When the MRE and a display panel are manufactured on the same substrate, the substrate 10 does not need to be a transparent glass material if the display panel is a top-emission type in which an image is realized in the reverse direction of the substrate 10, i.e., the direction opposite to the direction of the substrate 10. However, when the display panel is a bottom-emission type in which the image is realized in the direction of the substrate 10, or a dual-emission type in which the image is realized both in the direction of the substrate 10 and in the reverse direction of the substrate 10, the substrate 10 may include a transparent glass material.

In some cases, auxiliary layers (not shown), such as a barrier layer, a blocking layer, and/or a buffer layer, may be included as part of the substrate 10 or disposed on the substrate 10 to prevent an impurity ion from becoming diffused on the substrate 10, to prevent moisture or outdoor air from penetrating the substrate 10, and/or to flatten the surface of the substrate 10. The auxiliary layers may be formed by various deposition methods, such as plasma enhanced chemical vapor deposition (PECVD), atmospheric pressure CVD (APCVD), and low pressure CVD (LPCVD), by using $SiO_2$ and/or silicon nitride ($SiN_x$).

Figure 2:
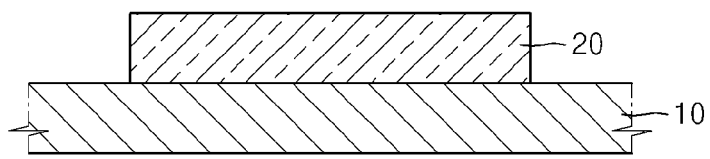

Next, as shown in FIG. 2, a first electrode 20 is formed on the substrate 10. The first electrode 20 may be formed by depositing at least one of silver (Ag), magnesium (Mg), aluminium (Al), platinum (Pt), palladium (Pd), gold (Au), nickel (Ni), neodymium (Nd), iridium (Ir), chromium (Cr), lithium (Li), calcium (Ca), and lithium fluoride (LiF), and compounds thereof at a small thickness. In some cases, the first electrode 20 may include a transparent metallic oxide, such as indium tin oxide (ITO), indium zinc oxide (IZO), zinc oxide (ZnO), or indium oxide ($In_2O_3$).

When the MRE is manufactured on the same substrate as a display panel, the first electrode 20 may be formed simultaneously with a pixel electrode of a display pixel unit. A material used for forming the first electrode 20 may vary depending on the emission type of the display panel.

For example, when the display panel is a top-emission type in which an image is realized in the reverse direction of the substrate 10, the first electrode 20 may include a reflective material, such as a reflective metal oxide. However, when the display panel is a bottom-emission type in which the image is realized in the direction of the substrate 10, or a dual-emission type in which the image is realized both in the direction of the substrate 10 and in the reverse direction of the substrate 10, the first electrode 20 may include a transparent material, such as a transparent metal oxide.

Figure 3:
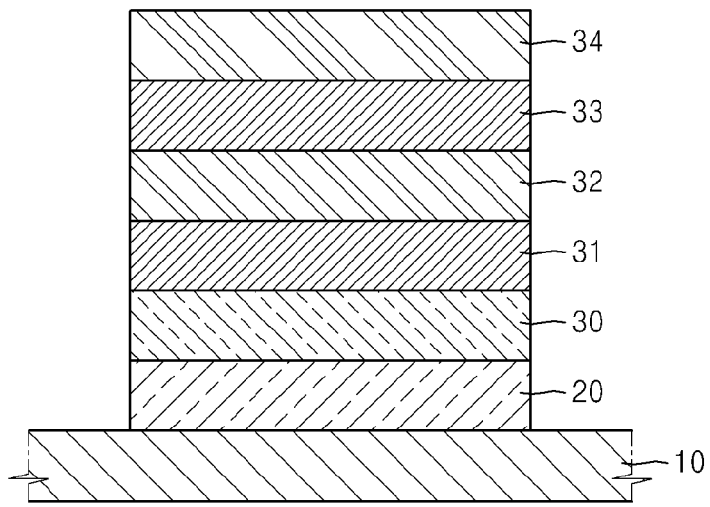

Next, as shown in FIG. 3, a first hole transport player (HTL) 30, a first magneto resistive layer 31, a first transport layer 32, a second magneto resistive layer 33, and a first electron transport layer (ETL) 34 are formed on the first electrode 20.

The first hole transport player (HTL) 30, the first magneto resistive layer 31, the first transport layer 32, the second magneto resistive layer 33, and the first electron transport layer (ETL) 34 may be formed by a deposition process or an evaporation process using a mask with a predetermined pattern or may be formed by a thermal transfer method using laser or an inkjet printing technology. Although FIG. 3 shows that each layer has the same shape, exemplary embodiments are not limited thereto, and the first hole transport layer 30 and the first electron transport layer 34 may also be formed without being patterned as common layers. FIG. 3 shows that the first electrode 20 also has the same shape as the other layers, such as first hole transport player (HTL) 30, the first magneto resistive layer 31, the first transport layer 32, the second magneto resistive layer 33, and the first electron transport layer (ETL) 34, but the illustration of the first electrode 20 in FIG. 3 is only for convenience of description and exemplary embodiments of the present disclosure are not limited thereto.

The first hole transport layer 30 may transport holes from the first electrode 20 to the first magneto resistive layer 31. Small molecule and macro-molecule materials may be used as materials for forming the first hole transport layer 30. For example, the first hole transport layer 30 may be formed on the first electrode 20 by deposition, evaporation, inkjet printing, or thermal transfer using laser as described above, by using poly-(2,4)-ethylene-dihydroxy thiophene (PEDOT) or polyaniline (PANI). In addition, at least one of copper phthalocyanine (CuPc), N,N'-Di(naphthalene-1-yl)-N,N'-diphenyl-benzidine (NPB), tris-8-hydroxyquinoline aluminum (Alq3), etc. may be used as a material of the first hole transport layer 30. The thickness of the first hole transport layer 30 may be regulated according to a material.

The first electron transport layer 34 may transport electrons from a second electrode 40 (shown in FIG. 4) to the second magneto resistive layer 33. Small molecule and macro-molecule materials may be used as materials for forming the first electron transport layer 34. For example, an aluminum complex such as an oxazole-based compound, an iso-oxazole-based compound, a triazole-based compound, iso-triazole-based compound, an oxadiazole-based compound, a thiodiazole-based compound, a perylene-based compound, tris-8-hydroxyquinoline aluminum (Alq3), bis(2-methyl-8-quinolato) (p-phenyl-phenolato) aluminum (Balq), bis(2-methyl-8-quilnolinato) (triphenylsiloxy) aluminum (III) (Salq), etc may be used. The thickness of the first electron transport layer 34 may be regulated according to a material.

The first magneto resistive layer 31 and the second magneto resistive layer 33 may each include a material that has a magneto resistive characteristic in that its resistance changes when an external magnetic field is applied. For example, the first magneto resistive layer 31 and the second magneto resistive layer 33 may include an organic material having a magneto resistance that varies according to an applied external magnetic field. If the intensity of the external magnetic field changes in the direction perpendicular to the direction of a current flowing through a magneto resistive material, a specific resistive component/material of the magneto resistive material changes according to the intensity of the magnetic field and thus changes the value of the current flowing through the magneto resistive material. By comparing the varying values of the current, it is possible to recognize a position of a magnetic material responding to the magnetic field.

The first magneto resistive layer 31 and the second magneto resistive layer 33 may include, for example, at least one of tris (8-hydroxyquinoline) aluminum (Alq3), poly (9,9-dioctylfluorene)(PFO), poly (phenylene ethynylene) (PPE), pentacene, regio-random Poly_3-octylthiophene-2,5-diyl (RRa-P3HT), and regio-regular Poly_3-hexylthiophene-2,5-diyl (RR-P3HT).

The first magneto resistive layer 31 and the second magneto resistive layer 33 may each include a core-type metallic complex compound that is obtained by surrounding a metal core with an organic material. For example, the first magneto resistive layer 31 and the second magneto resistive layer 33 may each include a metallic complex compound. The metallic complex compound may be a metal that is at least one of aluminum (Al), iron (Fe), cobalt (Co), and manganese (Mn), surrounded by an organic material such as tris (8-hydroxyquinoline) aluminum (Alq3), for example.

A MRE including at least two magneto resistive layers, such as the first and the second magneto resistive layers 31 and 33, may be ensured to have a high differential resistance fraction. Since the characteristic of materials in such magneto resistive layers (e.g., layers 31 and 33) appears in association with a bulk characteristic of the magneto resistive material, it is possible to increase a magneto resistive differential resistance fraction of the magneto resistive element by repetitively stacking the magneto resistive layers. The thickness of each magneto resistive layer may be variably set based on various factors including, for example, the type of magneto resistive material used therein. The bulk characteristic of a material indicates a characteristic that is determined regardless of size of the material. For example, a relatively good bulk characteristic of a material may refer to a material that has a uniform density throughout the material (e.g., a certain characteristic of the material can be uniformly distributed throughout the whole bulk of the material).

The first magneto resistive layer 31 and the second magneto resistive layer 33 may consist, in some cases, of the same component/material, and, in some cases, of different components/materials. Magneto resistive characteristics of the magneto resistive layers may be determined according to their respective components/materials of the magneto resistive layers. When various kinds of magneto resistive layers are stacked, the bulk characteristic of the whole magneto resistive layers may be improved and a high differential resistance fraction thereof may be ensured.

The first transport layer 32 may be a hole transport layer or an electron transport layer. That is, a hole transport layer or an electron transport layer may be disposed between the first magneto resistive layer 31 and the second magneto resistive layer 33. A hole transport layer or an electron transport layer may be used as the first transport layer 32 according to a desired configuration.

For example, since the mobility of electrons is remarkably faster than that of holes in the case of an organic compound, it is possible to form the first transport layer 32 as an electron transport layer when using organic compound materials in the first transport layer 32, so as to optimize the ratio of holes and electrons in the MRE.

In the case that the first transport layer 32 is a hole transport layer, the first transport layer 32 may function as a second hole transport layer. In the case that the first transport layer 32 is an electron transport layer, the first transport layer 32 may function as a second electron transport layer.

In some cases, the first transport layer 32 may also be a magneto resistive layer. Accordingly, the structure of FIG. 3 may have a structure in which three magneto resistive layers are sequentially stacked. In order to increase a differential resistance fraction of the magneto resistive element of FIG. 3 by increasing a magneto resistive characteristic thereof, it is possible to improve a bulk characteristic and increase the differential resistance fraction of the magneto resistive element by repetitively stacking magneto resistive layers including various materials.

The thickness of each layer of the magneto resistive element as shown in FIG. 3 may vary depending on a material.

Figure 4:
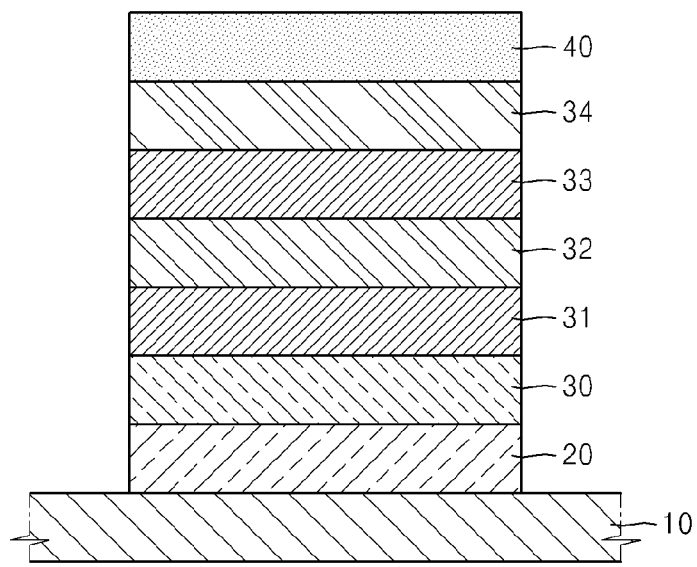

Next, the second electrode 40 is formed on the structure of FIG. 3, as shown in FIG. 4. The second electrode 40 may be formed by depositing at least one of Ag, Mg, Al, Pt, Pd, Au, Ni, Nd, Ir, Cr, Li, Ca, and LiF, and compounds thereof, as a layer having a small thickness. In some cases, the second electrode 40 may be made of transparent metallic oxide, such as at least one of ITO, IZO, ZnO, and $In_2O_3$.

When the MRE and a display panel are manufactured on the same substrate, the second electrode 40 may be formed simultaneously with a counter electrode of a display pixel unit. A material used for forming the second electrode 40 may be varied depending on the emission type of the display panel.

For example, when the display panel is a top-emission type in which an image is realized in the reverse direction of the substrate 10, the second electrode 40 may include a reflective material, such as a reflective metal oxide. However, when the display panel is a bottom-emission type in which the image is realized in the direction of the substrate 10, or a dual-emission type in which the image is realized both in the direction of the substrate 10 and in the reverse direction of the substrate 10, the second electrode 40 may include a transparent metal oxide, such as a transparent metal oxide.

Figure 5:
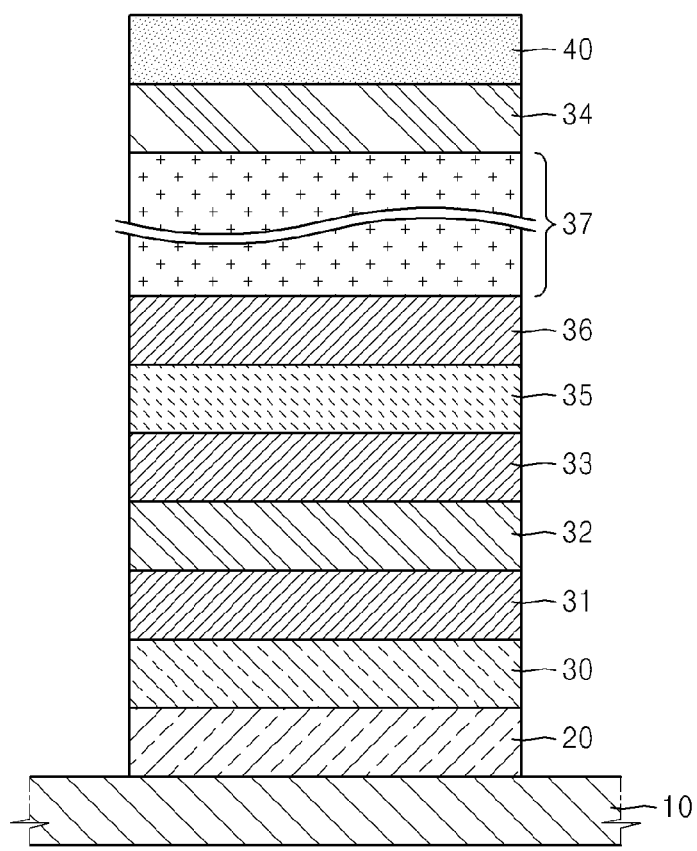
FIG. 5 is a schematic cross-sectional view of a structure of a magneto resistive element according to exemplary embodiments of the present disclosure.

FIG. 5 is a schematic cross-sectional view of a structure of a MRE according to exemplary embodiments of the present disclosure. Referring to FIG. 5, the MRE may have a structure in which a substrate 10, a first electrode 20, a first hole transport layer 30, a first magneto resistive layer 31, a first transport layer 32, a second magneto resistive layer 33, a second transport layer 35, a third magneto resistive layer 36, a first electron transport layer 34, and a second electrode 40 are sequentially formed.

The magneto resistive element of FIG. 5 may include at least three magneto resistive layers that are the first, second, and third magneto resistive layers 31, 33, and 36. In addition, a magneto resistive layer and a transport layer may be alternately repetitively formed in the space 37 between the third magneto resistive layer 36 and the first electron transport layer 34. As more magneto resistive layers are formed, the differential resistance fraction of the MRE increases. However, since the thickness of a display panel is limited when the MRE is formed with a pixel element in order to be applied to the display panel, the magneto resistive layers may be formed with a limited thickness.

The second transport layer 35 may be formed as a hole transport layer or an electron transport layer like the first transport layer 32 described above. That is, a hole transport layer or an electron transport layer may be disposed between the second magneto resistive layer 33 and the third magneto resistive layer 36. A hole transport layer or an electron transport layer may be used as the second transport layer 35 according to a desired configuration.

For example, since an organic compound has a characteristic that the mobility of electrons therein is remarkably faster than that of holes therein, it is possible to form the second transport layer 35 as an electron transport layer when using organic compound materials in the second transport layer 35 to optimize the ratio of holes and electrons in the MRE.

In some cases, the second transport layer 35 may also be a magneto resistive layer. In the case that both the first transport layer 32 and the second transport layer 35 are magneto resistive layers, the structure of FIG. 5 may have a structure in which five magneto resistive layers are sequentially stacked. In order to increase a magneto resistive characteristic of the magneto resistive layers, it is possible to improve a bulk characteristic and increase the differential resistance fraction of the magneto resistive layers by repetitively stacking magneto resistive layers including various materials.

The magneto resistive layers, such as the first, second, and third magneto resistive layers 31, 33, and 36, may each be formed as a dual layer structure that includes different components/materials. The composition of each of the magneto resistive layers may be at least one of tris (8-hydroxyquinoline) aluminum (Alq3), poly (9,9-dioctylfluorene)(PFO), poly (phenylene ethynylene) (PPE), pentacene, regio-random Poly__3-octylthiophene-2,5-diyl (RRa-P3HT), and regio-regular Poly__3-hexylthiophene-2,5-diyl (RR-P3HT). The magneto resistive layers may each include a metallic complex compound that is formed in such a manner that an organic material surrounds a metal selected from at least one of aluminum (Al), iron (Fe), cobalt (Co), and manganese (Mn), as previously described.

Figure 6:
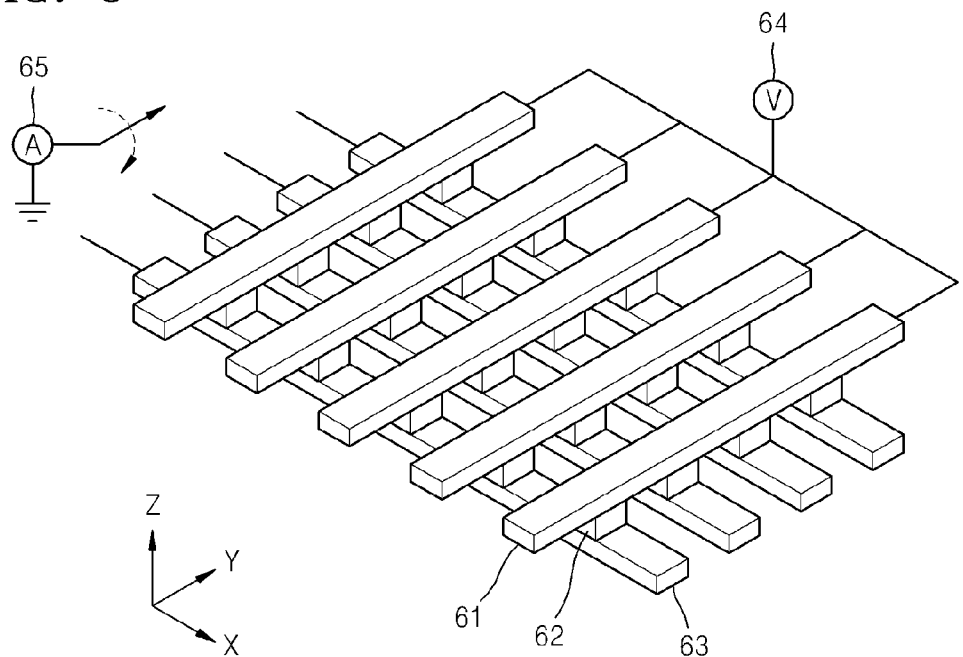
FIG. 6 is a schematic view of a digitizer sensing panel including a magneto resistive element according to exemplary embodiments of the present disclosure.

FIG. 6 is a schematic view of a digitizer sensing panel including a MRE according to exemplary embodiments of the present disclosure. Referring to FIG. 6, the digitizer sensing panel may include a first electrode 61 arranged in the Y-axis direction, a second electrode 63 arranged in the X-axis direction, and a MRE 62 arranged therebetween. The first and the second electrodes 61 and 63 may be the same or similar to the first and the second electrodes 20 and 40, respectively, of the MRE described with respect to FIGS. 3, 4, and 5. Accordingly, the MRE 62 of FIG. 6 may not include extra first and the second electrodes.

Referring to FIG. 6, a power supply 64 supplies power and a current may flow from the first electrode 61 to the second electrode 63 via the MRE 62. The current may be measured by the measuring unit 65. The measuring unit 65 may calculate a resistance of the MRE 62 based on the voltage of the power supply 64 and the current measured by the measuring unit 65.

The calculated resistance of the MRE 62 and a change of the resistance when a to magnetic pen approaches the magneto resistive element 62 may be determined. As noted above, a magnetic pen may generate a magnetic field. If the magnetic pen is in the proximity of the digitizer sensing panel of FIG. 6, a resistance of the MRE 62 may change, and the digitizer sensing panel may recognize the change in resistance of the MRE and thus recognize the position of the magnetic pen.

Although an example of one MRE 62 is described, the digitizer sensing panel may include a plurality of MREs 62 as shown in FIG. 6. The digitizer sensing panel may include a MRE 62 wherever the first electrodes 61 and the second electrodes 63 cross each other. The digitizer sensing panel use the included MREs 62 to recognize a 2D input made along the X-axis and the Y-axis.

According to exemplary embodiments of the present disclosure, a display device may include a MRE, and may use the MRE to recognize an input made by a magnetic pen that generates a magnetic field.

Figure 7:
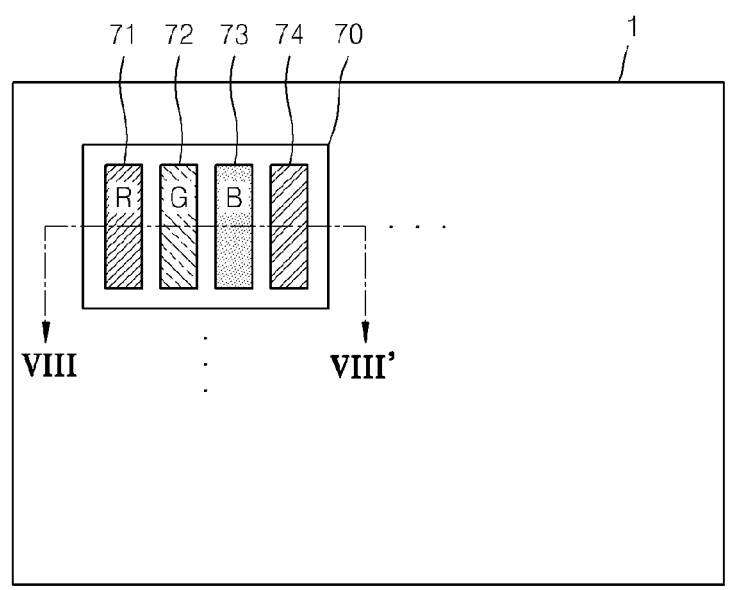
FIG. 7 is an example of a subpixel of a display device including a magneto resistive element according to exemplary embodiments of the present disclosure.

FIG. 7 is an example of a pixel of a display device including a MRE and of a display device including a pixel. Referring to FIG. 7, a display device 1 includes a plurality of pixels 70. Although FIG. 7 shows one pixel for convenience, the display device 1 may include a plurality of pixels. The plurality of pixels 70 may be arranged to be aligned in a row direction and/or in a column direction. Referring to FIG. 7, a pixel 70 may include a MRE 74 along with Red, Green, and Blue (RGB) sub-pixels 71, 72, and 73. Although not shown in FIG. 7, the pixel 70 may also include a pixel electrode, and a group of pixels 70 may form the display device. However, the arrangement of the MREs 74 in pixels 70 of the display device is not limited thereto, and the digitizer sensing panel of FIG. 6 may be overlapped with a display panel or may be formed on various other positions.

Figure 8:
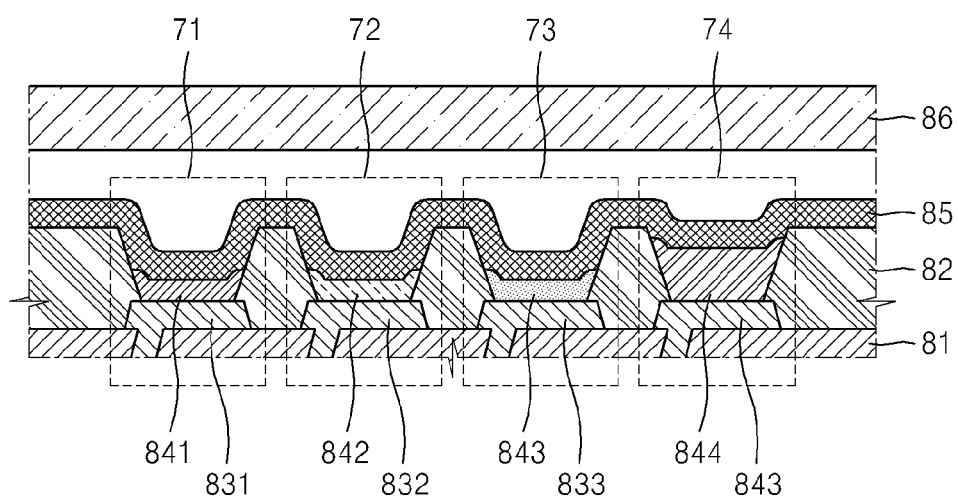
FIG. 8 is a cross-sectional view taken along line VIII-VIII' of FIG. 7 according to exemplary embodiments of the present disclosure.

FIG. 8 is a cross-sectional view taken along line VIII-VIII' of FIG. 7. The pixel 70 in FIG. 7 includes a plurality of organic light emitting elements 71, 72, and 73 and the MRE 74. An insulating layer 82 is disposed between each of the organic light emitting elements 71, 72, and 73 and the MRE 74.

Referring to FIG. 8, the organic light emitting elements 71, 72, and 73 sequentially includes pixel electrodes 831, 832, and 833, intermediate layers 841, 842, and 843, and a counter electrode 85, respectively. The organic light emitting elements 71, 72, and 73 are formed on a planarized layer 81.

The intermediate layers 841, 842, and 843 of the organic light emitting elements include light emitting layers, each of which emits the same or different kinds of light. The display device 1 may further include a color filter layer according to a design of the organic light emitting element.

Referring to FIG. 8, the MRE 74 sequentially includes a first electrode 834, an intermediate layer 844, and a second electrode 85. The intermediate layer 844 of the MRE includes multi layers.

The intermediate layer 844 of the MRE sequentially includes a first hole transport layer, a first magneto resistive layer, a first transport layer, a second magneto resistive layer, and a first electron transport layer, and the first magneto resistive layer and the second magneto resistive layer include organic materials. According to exemplary embodiments, the MRE 74 is formed on the planarized layer 81.

The planarized layer 81 is formed on a substrate (not shown), and a plurality of transistors that are connected to each of the organic light emitting elements 71, 72, and 73 or the MRE 74 are arranged between the planarized layer 81 and the substrate.

Referring to FIG. 8, the display device 1 includes a sealing substrate 86 that seals elements formed on the substrate. The sealing substrate 86 isolates the elements on the substrate from external moisture, air, etc. The sealing substrate 86 may include glass, plastic, or stainless steel without limitation or may include an inorganic or organic thin film.

The structure of the display device 1, as shown in FIG. 8, is a structure according to exemplary embodiments of the present invention and thus the present invention is not limited thereto. For example, according to another embodiment of the present invention, the MRE may be arranged on layers other than the light emitting elements. For example, a touch panel including the MRE may be arranged to overlap with a display panel that includes a light emitting element.

According to exemplary embodiments of the present disclosure, a MRE may include at least two magneto resistive layers that each include organic material having a magneto resistance. Accordingly, the MRE may be ensured to have a high differential resistance fraction through the inclusion of a repetitive layer structure made up of organic magneto resistive materials. A digitizer sensing panel including a MRE with high differential resistance fraction may recognize an input from the magnetic pen with high sensitivity and at a high resolution.

In each mask process for forming the above-described MREs, the removal of a stacked film may be performed by using dry etching or wet etching. In addition, for clarification and ease of description, only one MRE is shown in the drawings for explaining exemplary embodiments of the present disclosure. However, it should be understood that the present disclosure is not limited thereto and a plurality of MREs may be formed as long as the number of mask processes does not increase.

It will be apparent to those skilled in the art that various modifications and variations can be made in the present disclosure without departing from the spirit or scope of the disclosed subject matter. Thus, it is intended that the present disclosure cover the modifications and variations of the disclosed subject matter provided they come within the scope of the appended claims and their equivalents.

What is claimed is:

1. A magneto resistive element, comprising:
a substrate;
a first electrode disposed on the substrate;
a first hole transport layer disposed on the first electrode;
a first magneto resistive layer disposed on the first hole transport layer;
a first transport layer disposed on the first magneto resistive layer;
a second magneto resistive layer disposed on the first transport layer;
a first electron transport layer disposed on the second magneto resistive layer; and
a second electrode disposed on the first electron transport layer,
wherein each of the first magneto resistive layer and the second magneto resistive later comprises an organic material.

2. The magneto resistive element of claim 1, wherein the first transport layer comprises a second hole transport layer or a second electron transport layer.

3. The magneto resistive element of claim 1, wherein the first magneto resistive layer comprises different materials than the second magneto resistive layer.

4. The magneto resistive element of claim 1, wherein each of the first magneto resistive layer and the second magneto resistive layer comprises at least one of tris (8-hydroxyquinoline) aluminum (Alq3), poly (9,9-dioctylfluorene)(PFO), poly (phenylene ethynylene) (PPE), pentacene, regio-random Poly_3-octylthiophene-2,5-diyl (RRa-P3HT), and regio-regular Poly_3-hexylthiophene-2,5-diyl (RR-P3HT).

5. The magneto resistive element of claim 1, wherein each of the first magneto resistive layer and the second magneto resistive layer comprises a metallic complex compound in which the organic material surrounds a metal of the metallic complex.

6. The magneto resistive element of claim 5, wherein each of the metal comprises at least one of aluminum (Al), iron (Fe), cobalt (Co), and manganese (Mn).

7. The magneto resistive element of claim 1, further comprising a second transport layer and a third magneto resistive layer disposed on the second magneto resistive layer, wherein the second transport layer comprises a third hole transport layer or a third electron transport layer.

8. The magneto resistive element of claim 1, wherein the first magneto resistive layer comprises at least two layers having different materials and the second magneto resistive layer comprises at least two layers having different materials.

9. A digitizer sensing panel, comprising:
   a substrate;
   a first electrode disposed on the substrate;
   a second electrode disposed on the substrate; and
   a magneto resistive element disposed on the substrate, wherein the magneto resistive element comprises the first electrode, a first hole transport layer, a first magneto resistive layer, a first transport layer, a second magneto resistive layer, a first electron transport layer, and the second electrode,
   wherein each of the first magneto resistive layer and the second magneto resistive later comprises an organic material, and
   wherein the magneto resistive element is configured to detect an input corresponding to a magnetic field.

10. A display device, comprising:
    a substrate;
    an organic light-emitting diode (OLED) disposed on the substrate, wherein the OLED comprises a pixel electrode, an intermediate layer, and a counter electrode; and
    a magneto resistive element disposed on the substrate, wherein the magneto resistive element comprises a first electrode, a first hole transport layer, a first magneto resistive layer, a first transport layer, a second magneto resistive layer, a first electron transport layer, and a second electrode,
    wherein each of the first magneto resistive layer and the second magneto resistive later to comprises an organic material, and
    wherein the magneto resistive element is configured to detect an input corresponding to a magnetic field.

11. The display device of claim 10, wherein the magneto resistive element, a red sub-pixel, a green sub-pixel, and a blue sub-pixel are disposed in a pixel of the display device.

12. A method of manufacturing a magneto resistive element, the method comprising:
    forming a first electrode on a substrate;
    forming a first hole transport layer, a first magneto resistive layer, a first transport layer, a second magneto resistive layer, and a first electron transport layer on the first electrode; and
    forming a second electrode on the first electron transport layer,
    wherein each of the first magneto resistive layer and the second magneto resistive layer comprises an organic material.

13. The method of claim 12, wherein the first transport layer comprises a second hole transport layer or a second electron transport layer.

14. The method of claim 12, wherein the first magneto resistive layer comprises different materials than the second magneto resistive layer.

15. The method of claim 12, wherein the first hole transport layer, the first magneto resistive layer, the first transport layer, the second magneto resistive layer, and the first electron transport layer are sequentially formed on the first electrode.

16. The method of claim 12, wherein each of the first magneto resistive layer and the second magneto resistive layer comprises at least one of tris (8-hydroxyquinoline) aluminum (Alq3), poly (9,9-dioctylfluorene) (PFO), poly (phenylene ethynylene) (PPE), pentacene, regio-random Poly__3-octylthiophene-2,5-diyl (RRa-P3HT), and regio-regular Poly__3-hexylthiophene-2,5-diyl (RR-P3HT).

17. The method of claim 12, wherein each of the first magneto resistive layer and the second magneto resistive layer comprises a metallic complex compound comprising at least one of aluminum (Al), iron (Fe), cobalt (Co), and manganese (Mn), surrounded by the organic material.

18. The method of claim 12, further comprising forming a second transport layer and a third magneto resistive layer on the second magneto resistive layer, and forming the first electron transport layer on the third magneto resistive layer, wherein the second transport layer comprises a third hole transport layer or a third electron transport layer.

19. The method of claim 12, wherein the first magneto resistive layer comprises at least two layers having different materials and the second magneto resistive layer comprises at least two layers having different materials.

* * * * *